United States Patent
Lin et al.

(10) Patent No.: US 11,018,134 B2
(45) Date of Patent: May 25, 2021

(54) SEMICONDUCTOR DEVICE AND METHOD FOR MANUFACTURING THE SAME

(71) Applicant: TAIWAN SEMICONDUCTOR MANUFACTURING CO., LTD., Hsinchu (TW)

(72) Inventors: Chung-Te Lin, Tainan (TW); Wei-Yuan Lu, Taipei (TW); Feng-Cheng Yang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/715,310

(22) Filed: Sep. 26, 2017

(65) Prior Publication Data
US 2019/0096880 A1    Mar. 28, 2019

(51) Int. Cl.
| | |
|---|---|
| *H01L 27/088* | (2006.01) |
| *H01L 29/06* | (2006.01) |
| *H01L 23/48* | (2006.01) |
| *H01L 23/522* | (2006.01) |
| *H01L 27/06* | (2006.01) |
| *H01L 29/66* | (2006.01) |
| *H01L 27/11* | (2006.01) |
| *H01L 49/02* | (2006.01) |
| *H01L 21/8234* | (2006.01) |
| *H01L 27/22* | (2006.01) |
| *H01L 21/8258* | (2006.01) |

(52) U.S. Cl.
CPC .... *H01L 27/088* (2013.01); *H01L 21/823475* (2013.01); *H01L 23/481* (2013.01); *H01L 23/5222* (2013.01); *H01L 23/5226* (2013.01); *H01L 27/0688* (2013.01); *H01L 27/1104* (2013.01); *H01L 27/22* (2013.01); *H01L 28/40* (2013.01); *H01L 29/0653* (2013.01); *H01L 29/66545* (2013.01); *H01L 21/8258* (2013.01); *H01L 27/0605* (2013.01)

(58) Field of Classification Search
CPC ............ H01L 21/8221; H01L 27/0688; H01L 27/1207; H01L 25/0657; H01L 21/823871; H01L 23/5276
See application file for complete search history.

(56) References Cited

U.S. PATENT DOCUMENTS

| | | | | |
|---|---|---|---|---|
| 5,148,244 A | * | 9/1992 | Iwasaki | H01L 27/095 257/773 |
| 5,354,386 A | * | 10/1994 | Cheung | H01L 21/31116 148/33.3 |
| 5,770,483 A | * | 6/1998 | Kadosh | H01L 21/8221 257/E21.575 |

(Continued)

*Primary Examiner* — John A Bodnar
(74) *Attorney, Agent, or Firm* — McClure, Qualey & Rodack, LLP

(57) ABSTRACT

A semiconductor device is provided. The semiconductor device includes a first transistor, a first interconnect structure, and a second transistor. The first transistor has a first gate length. The first interconnect structure is over the first transistor. The second transistor is over the first interconnect structure. The second transistor is electrically coupled to the first transistor through the first interconnect structure. The second transistor has a second gate length, and the first gate length is shorter than the second gate length.

20 Claims, 20 Drawing Sheets

(56) References Cited

U.S. PATENT DOCUMENTS

| | | | | |
|---|---|---|---|---|
| 5,834,350 | A * | 11/1998 | Gardner | H01L 21/8221 438/300 |
| 6,392,253 | B1 * | 5/2002 | Saxena | H01L 21/8221 257/347 |
| 6,713,835 | B1 * | 3/2004 | Horak | H01L 21/7682 257/522 |
| 6,716,710 | B1 * | 4/2004 | Thio | H01L 21/76224 257/E21.546 |
| 2001/0027005 | A1 * | 10/2001 | Moriwaki | H01L 21/823842 438/592 |
| 2006/0113605 | A1 * | 6/2006 | Currie | H01L 21/84 257/368 |
| 2009/0068835 | A1 * | 3/2009 | La Tulipe, Jr. | H01L 23/481 438/656 |
| 2013/0285125 | A1 * | 10/2013 | Chen | H01L 24/13 257/288 |
| 2015/0102419 | A1 * | 4/2015 | Ikeda | H01L 21/823807 257/369 |
| 2015/0318395 | A1 * | 11/2015 | Uozumi | H01L 23/535 257/288 |
| 2016/0043060 | A1 * | 2/2016 | Kabe | H01L 24/08 257/774 |
| 2018/0108607 | A1 * | 4/2018 | Farooq | H01L 25/105 |

\* cited by examiner

SEMICONDUCTOR DEVICE AND METHOD FOR MANUFACTURING THE SAME

BACKGROUND

Manufacturing of an integrated circuit (IC) has been driven by increasing the density of the IC formed in a semiconductor device. This is accomplished by implementing more aggressive design rules to allow a larger density of the IC device to be formed. Nonetheless, the increased density of IC devices, such as transistors, has also increased the complexity of processing semiconductor devices with decreased feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
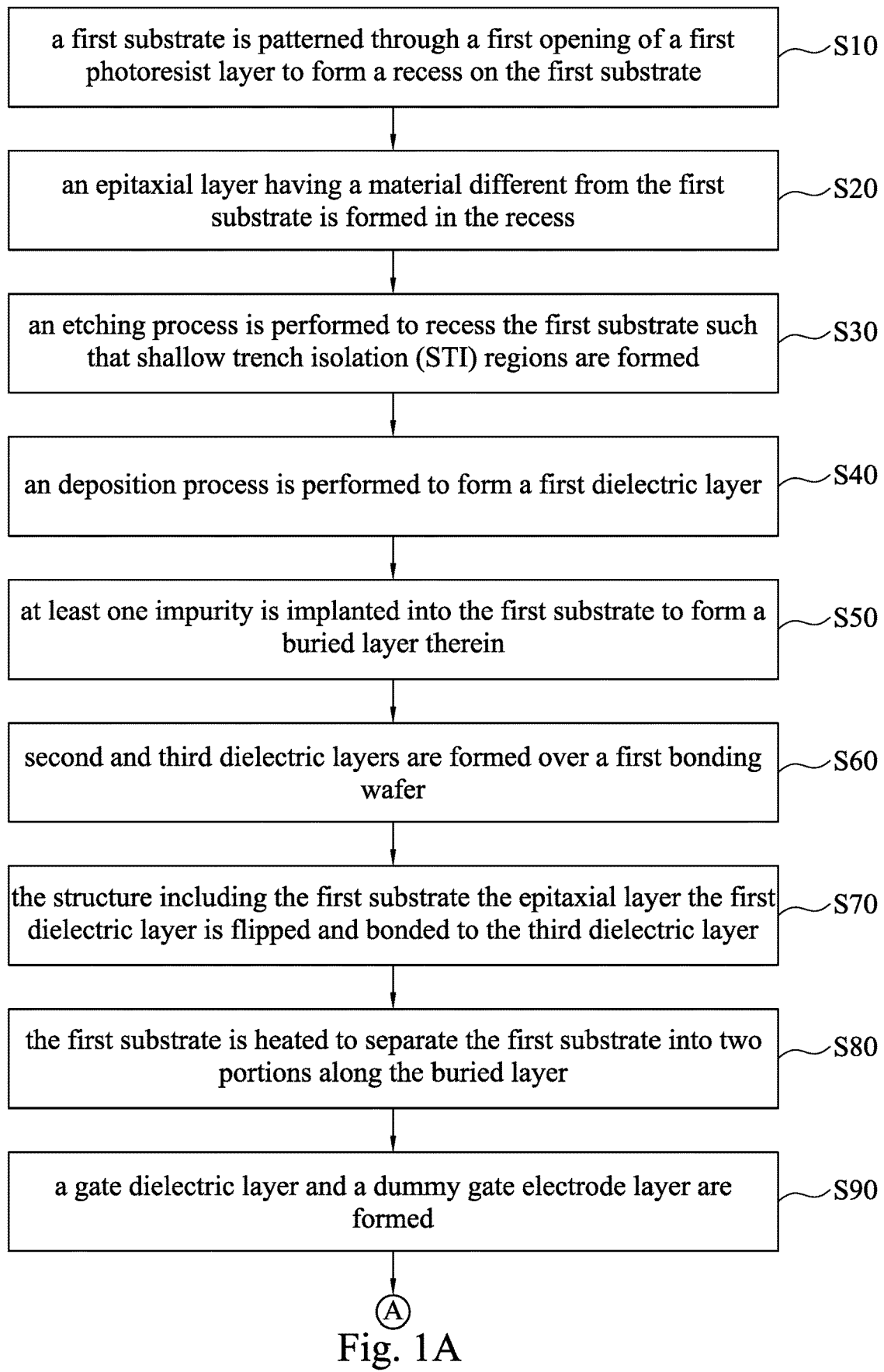
FIGS. 1A and 1B are flowcharts of a method for manufacturing a semiconductor device in accordance with some embodiments of the present disclosure.

The following disclosure provides many different embodiments, or examples, for implementing different features of the provided subject matter. Specific examples of components and arrangements are described below to simplify the present disclosure. these are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
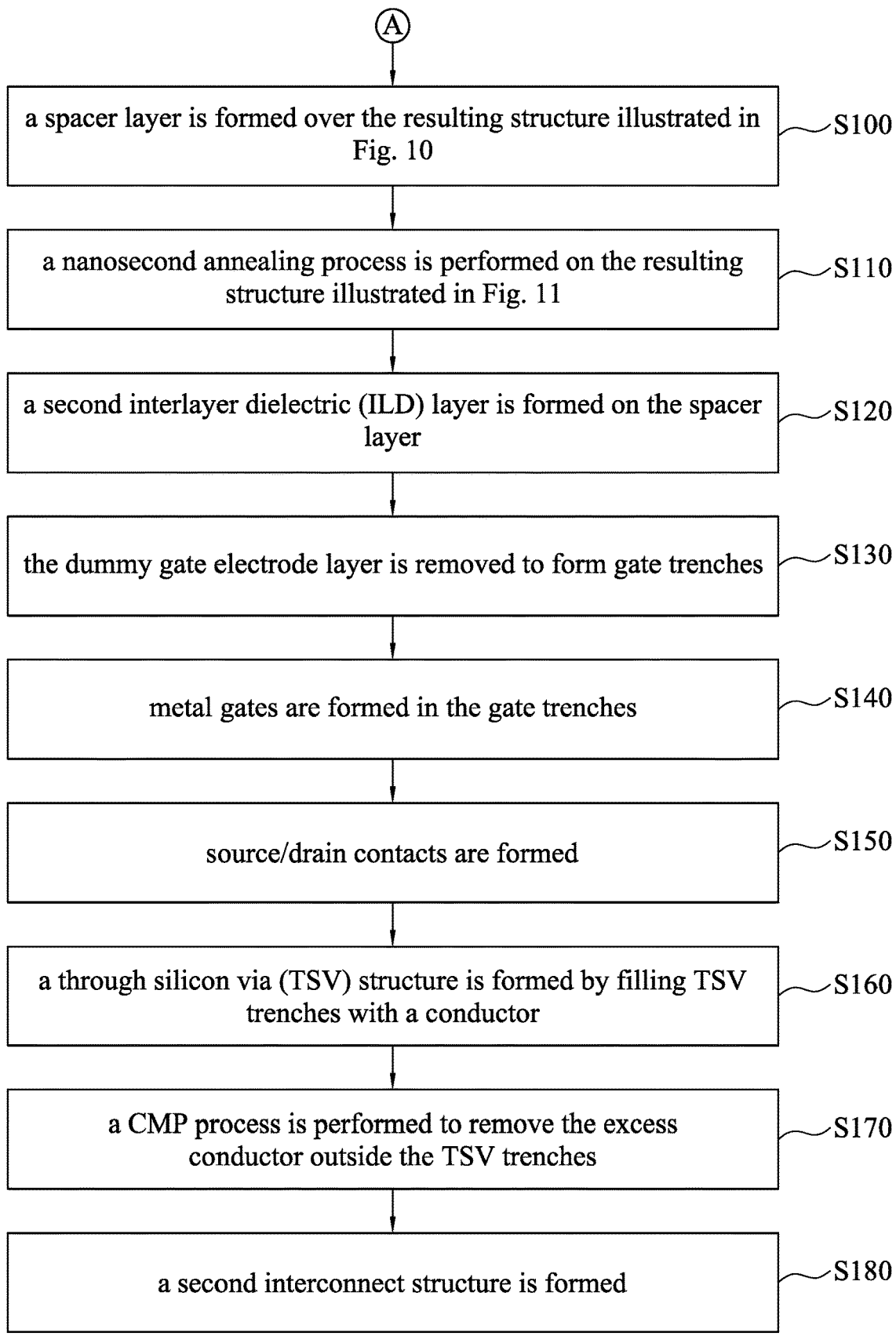

FIGS. 1A and 1B are flowcharts of a method for manufacturing a semiconductor device in accordance with some embodiments of the present disclosure. FIGS. 2-19 illustrate a method of forming a semiconductor device in accordance with some embodiments of the present disclosure.

Figure 2:
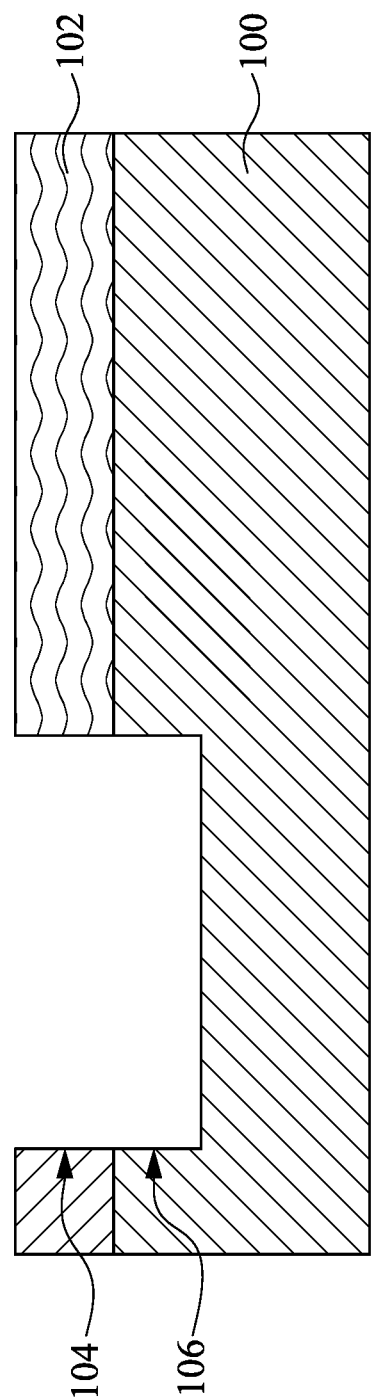
FIGS. 2-19 illustrate a method of forming a semiconductor device in accordance with some embodiments of the present disclosure.
Figure 3:
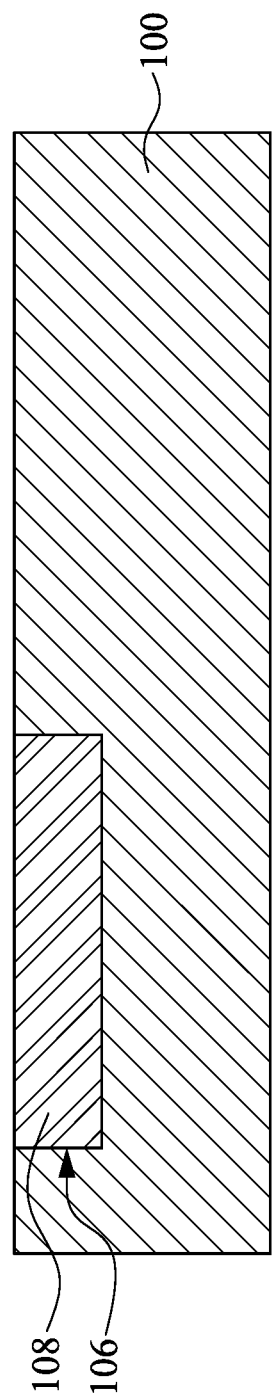
Figure 4:
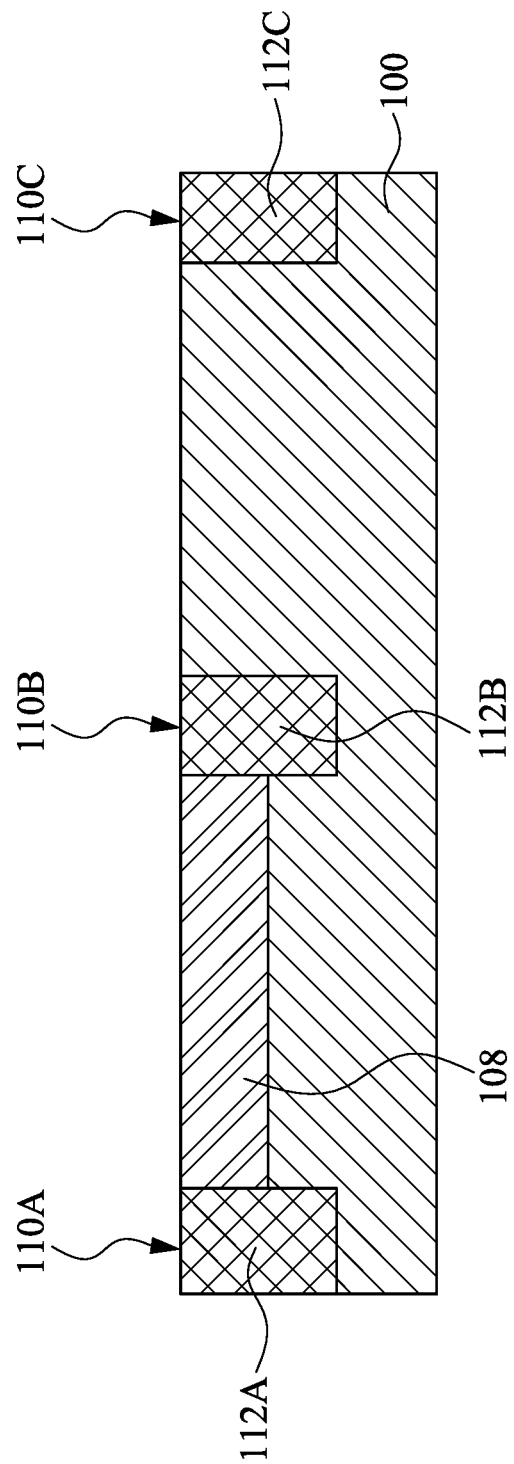
Figure 5:
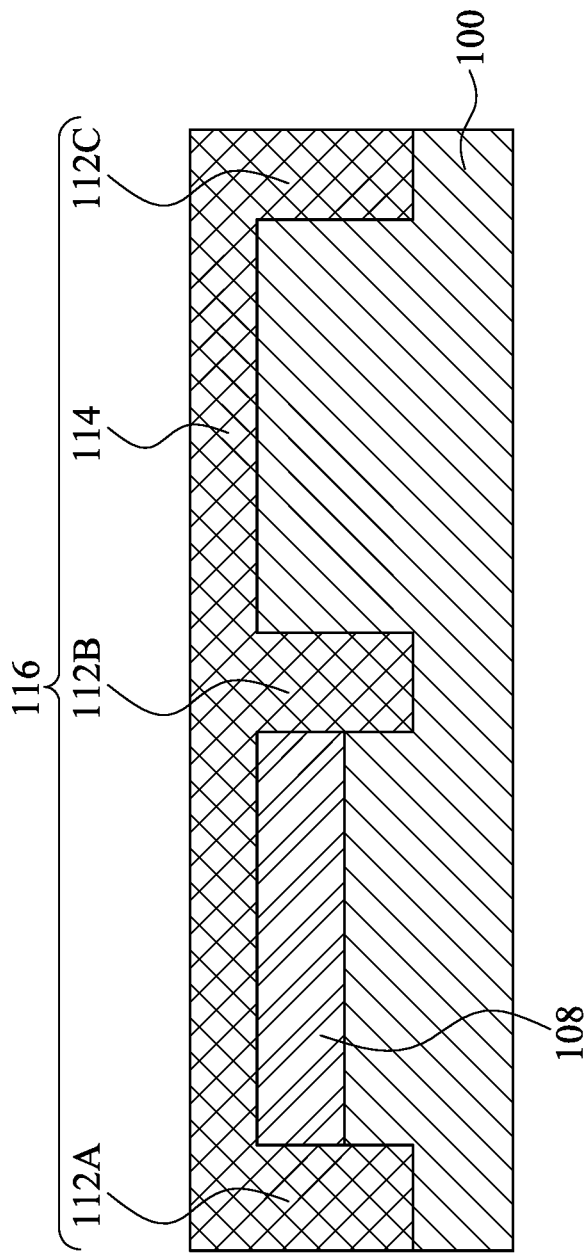
Figure 6:
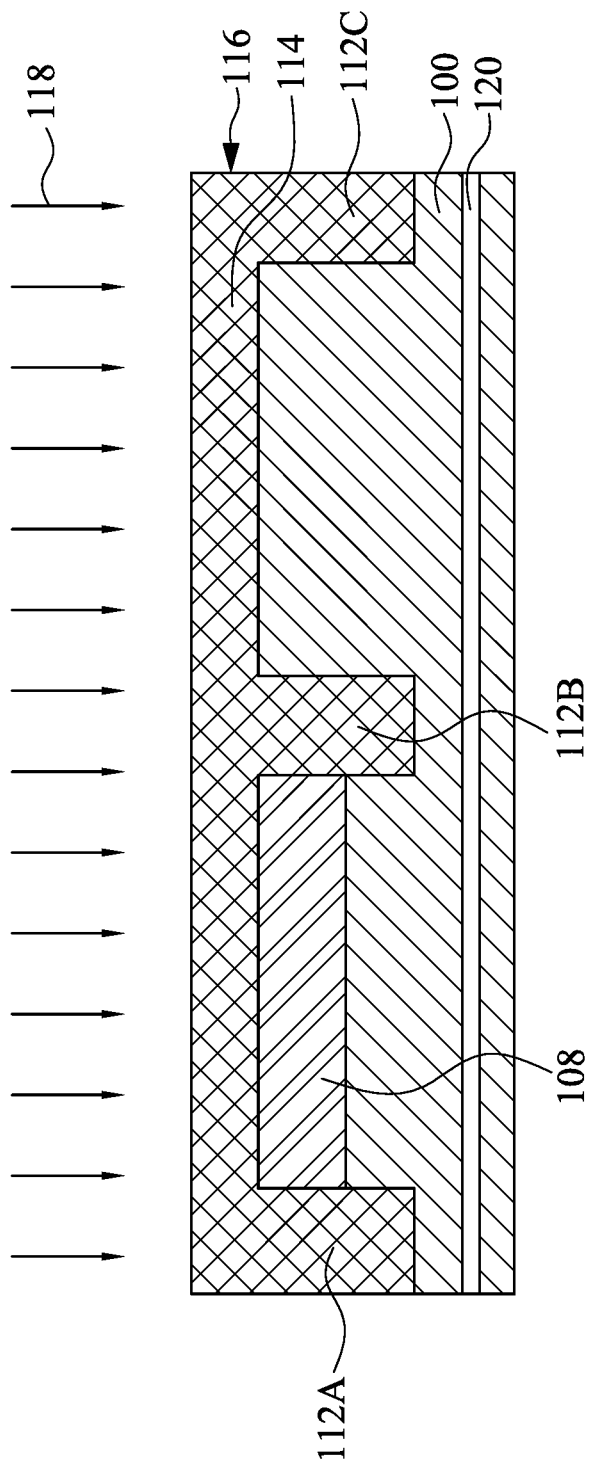
Figure 7:
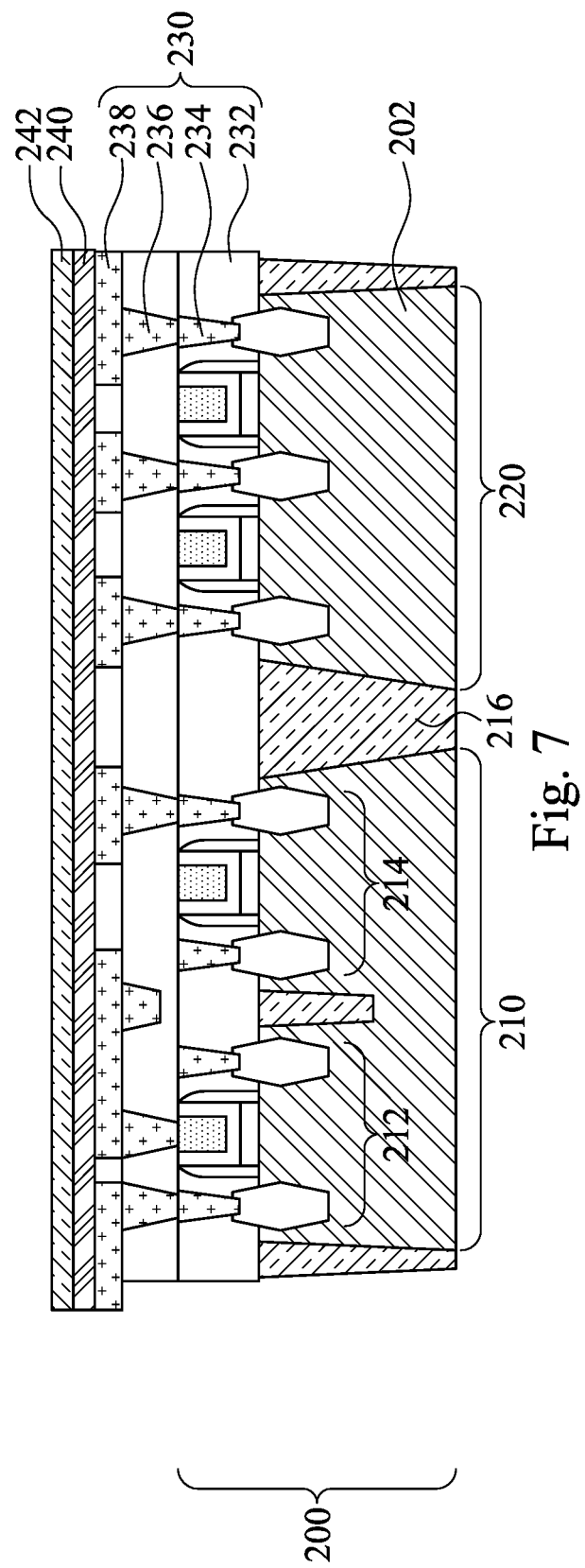
Figure 8:
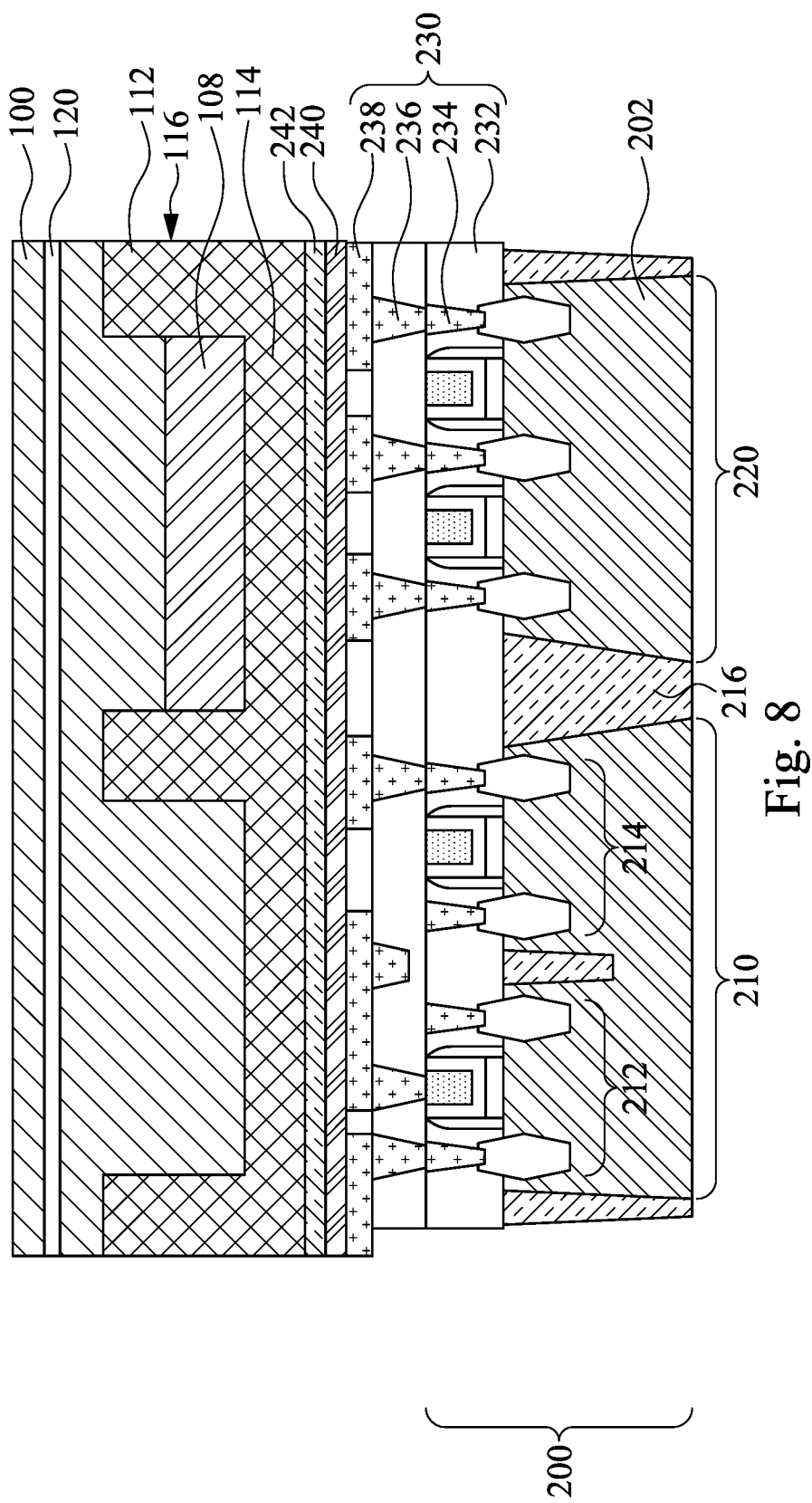
Figure 9:
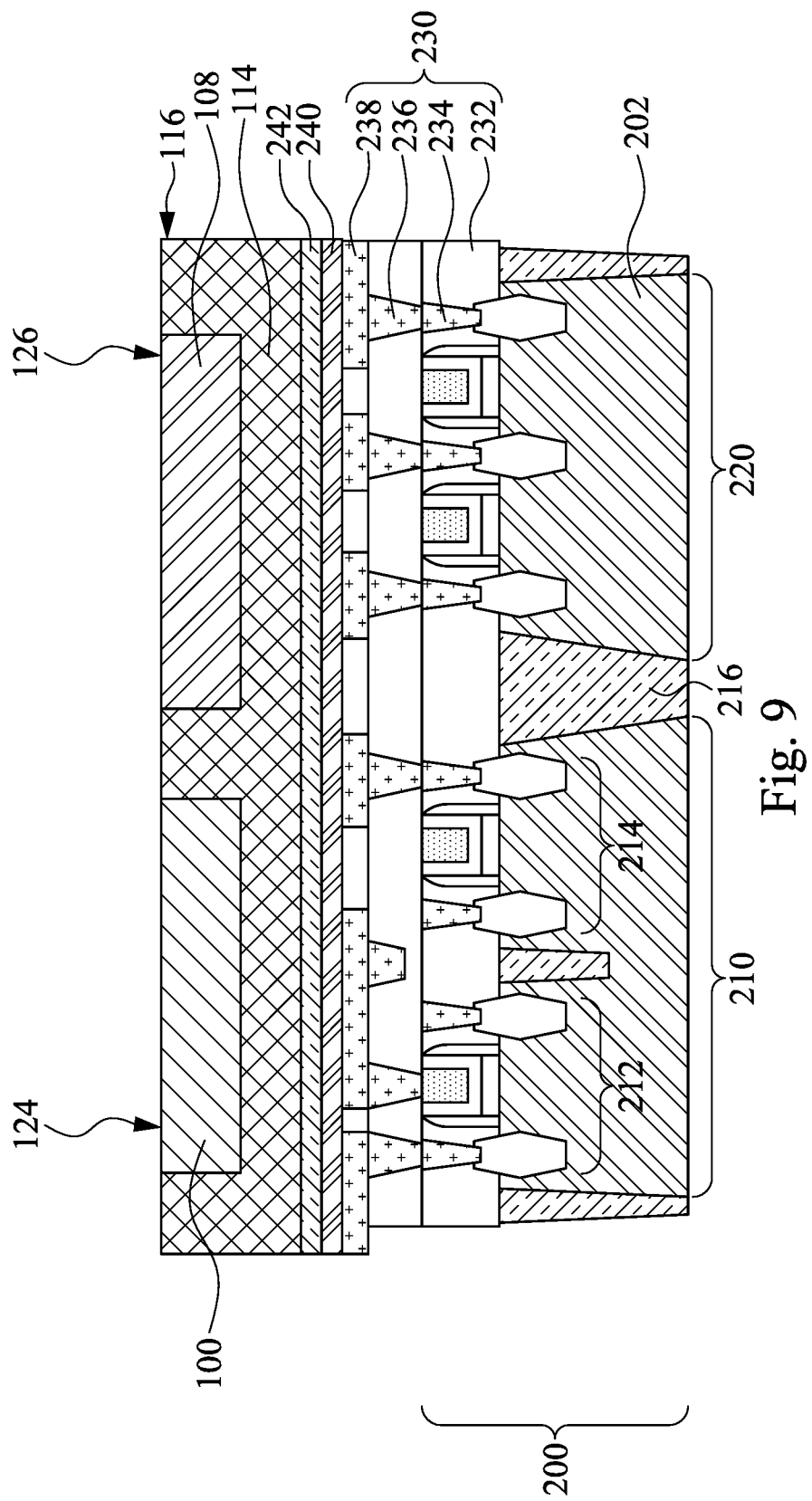
Figure 10:
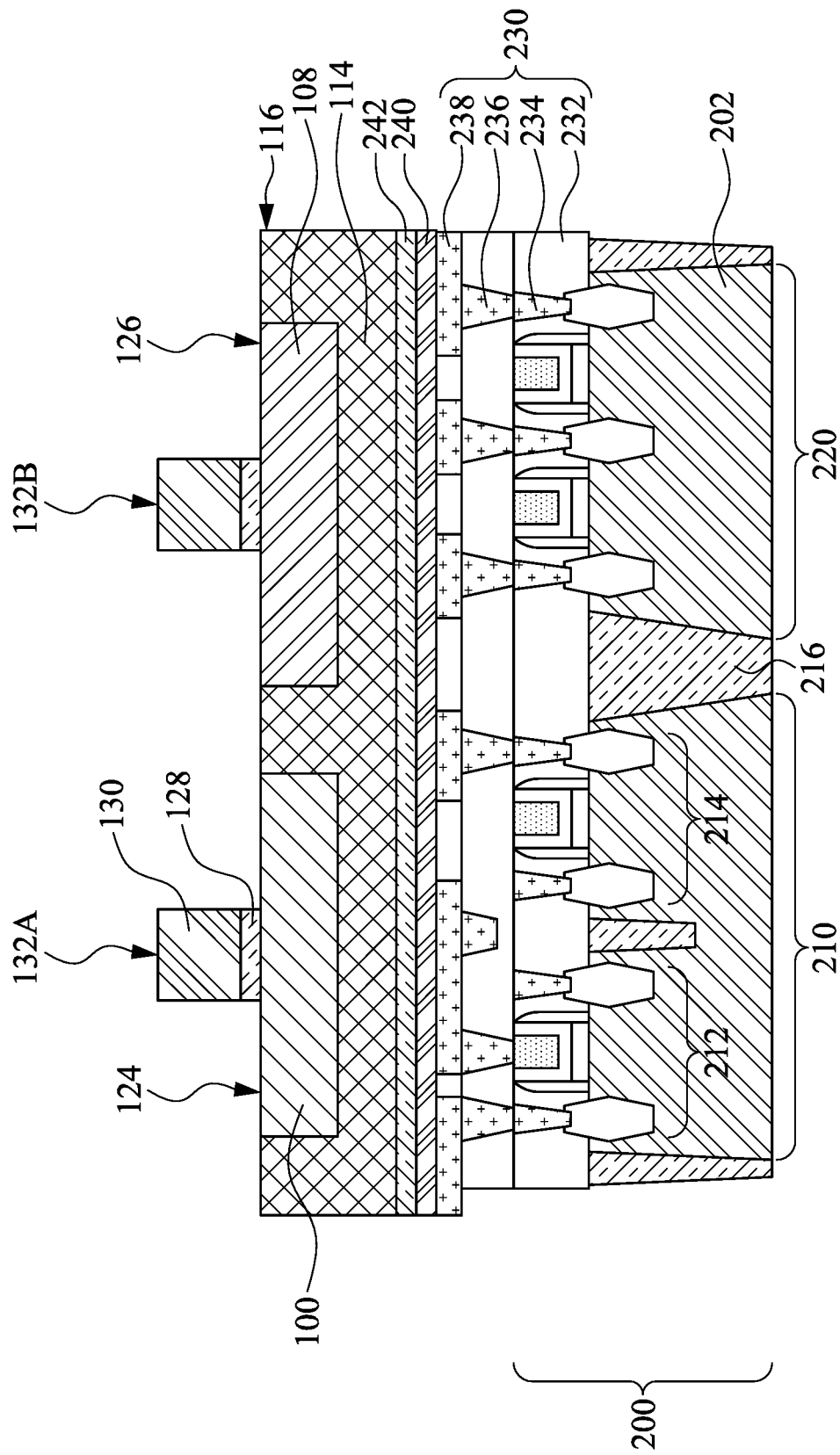
Figure 11:
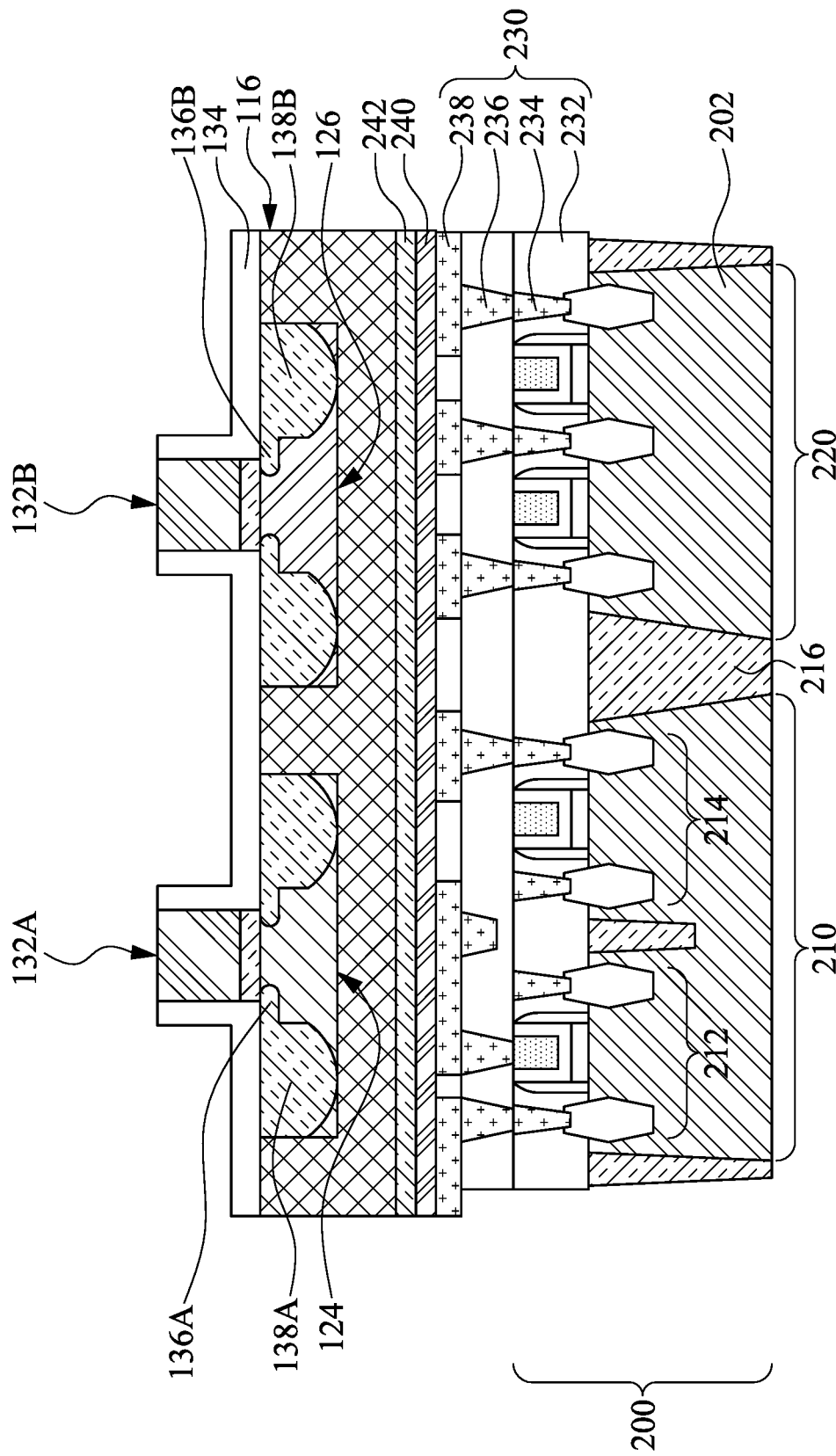
Figure 12:
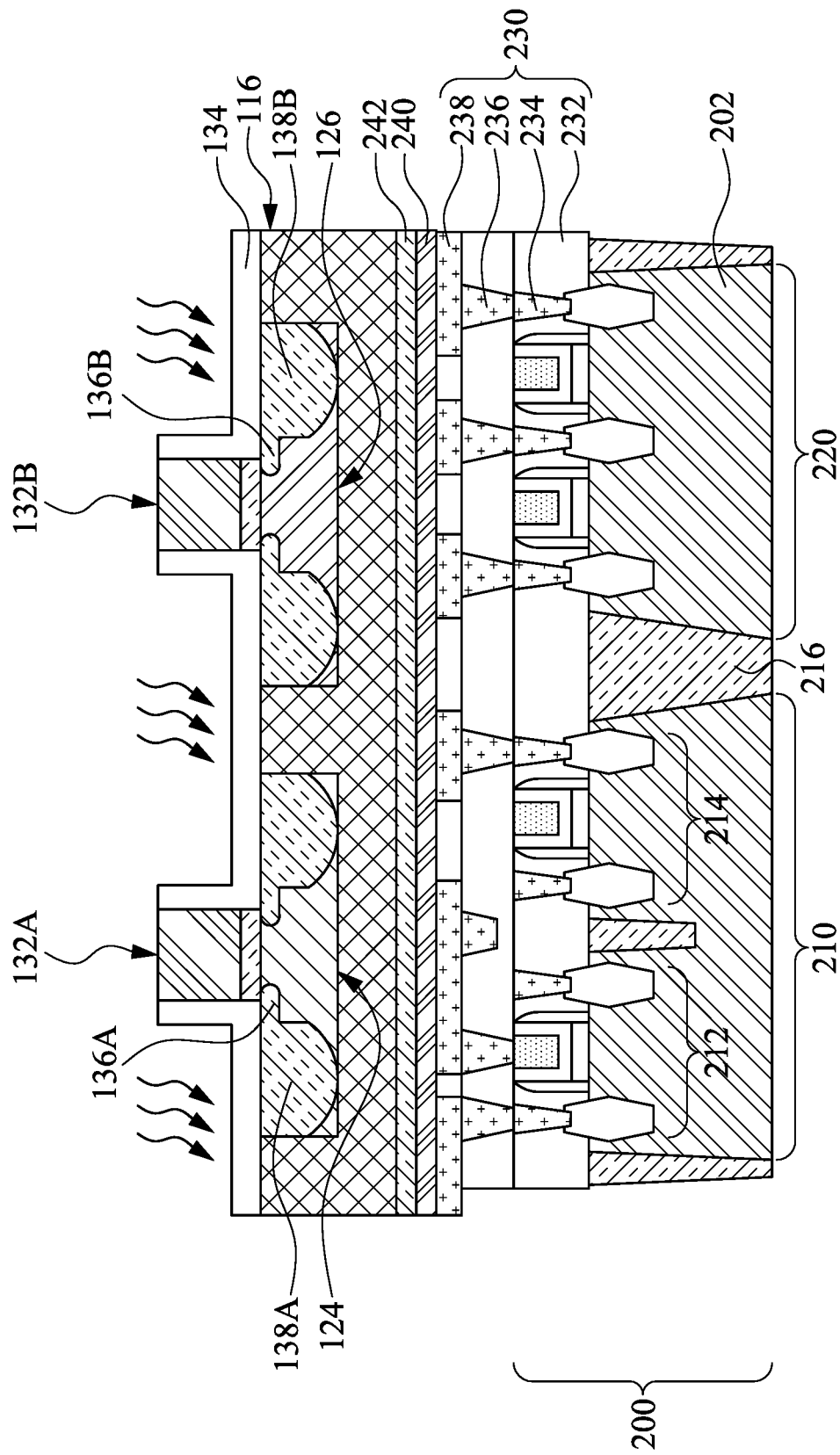
Figure 13:
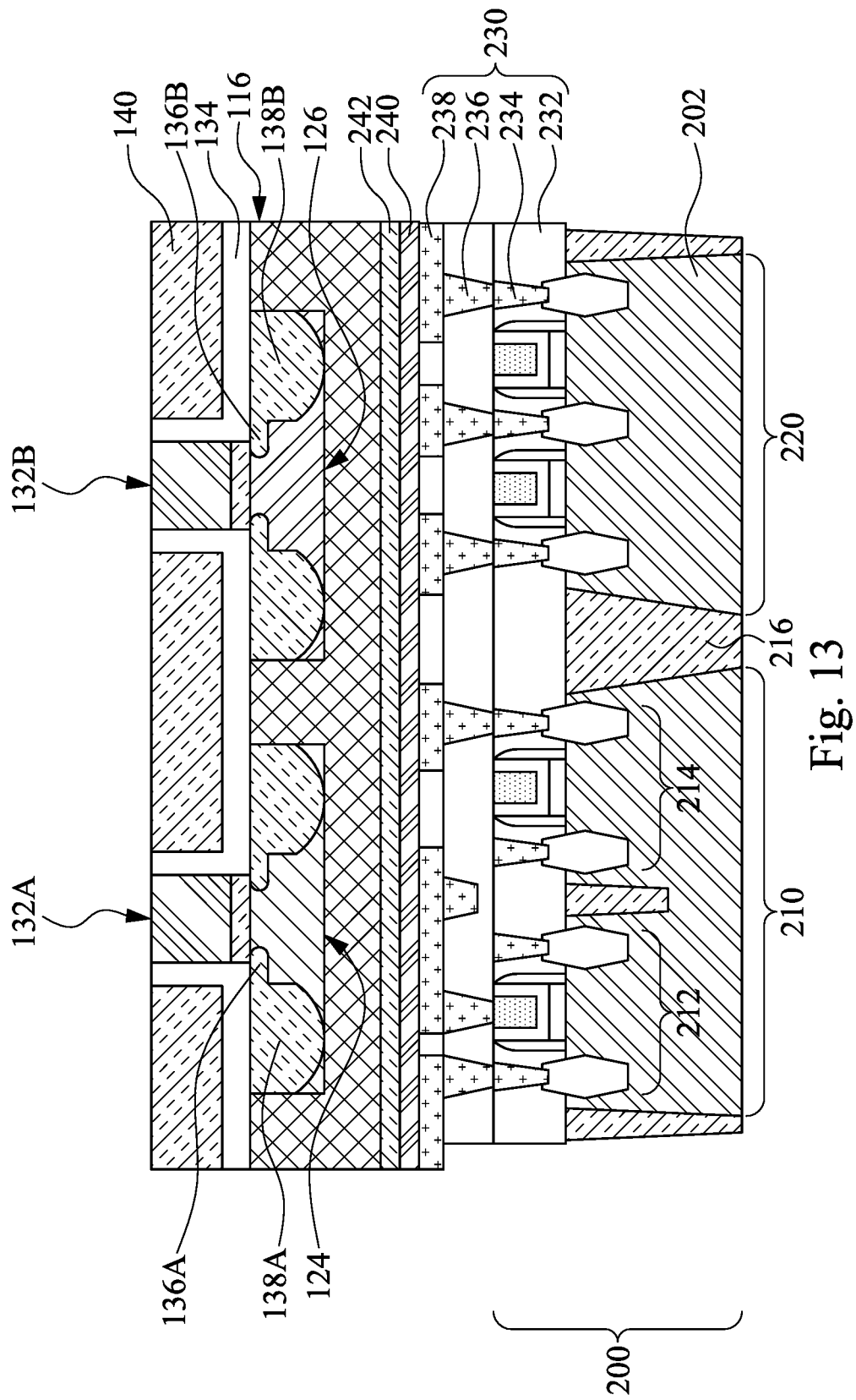
Figure 14:
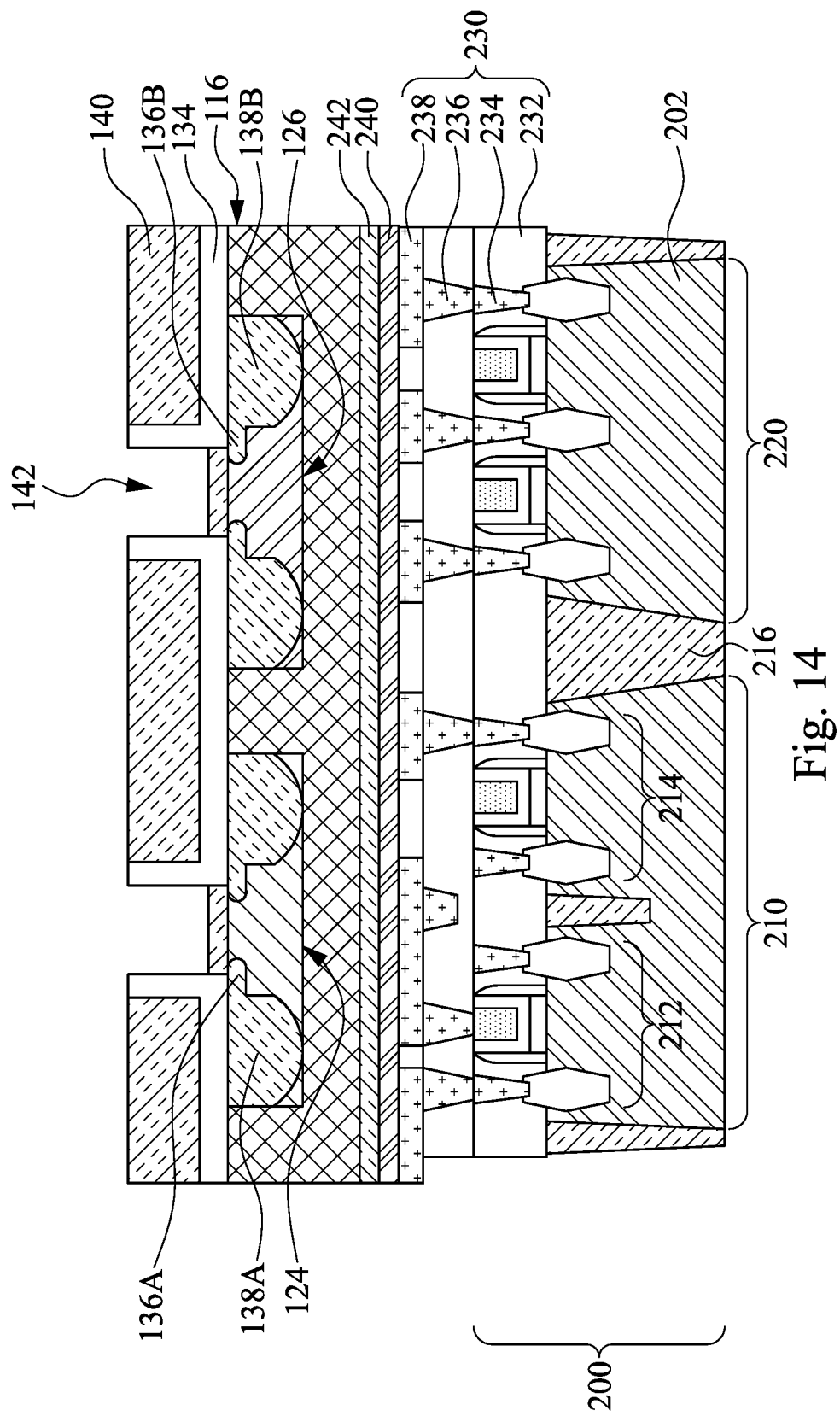
Figure 15:
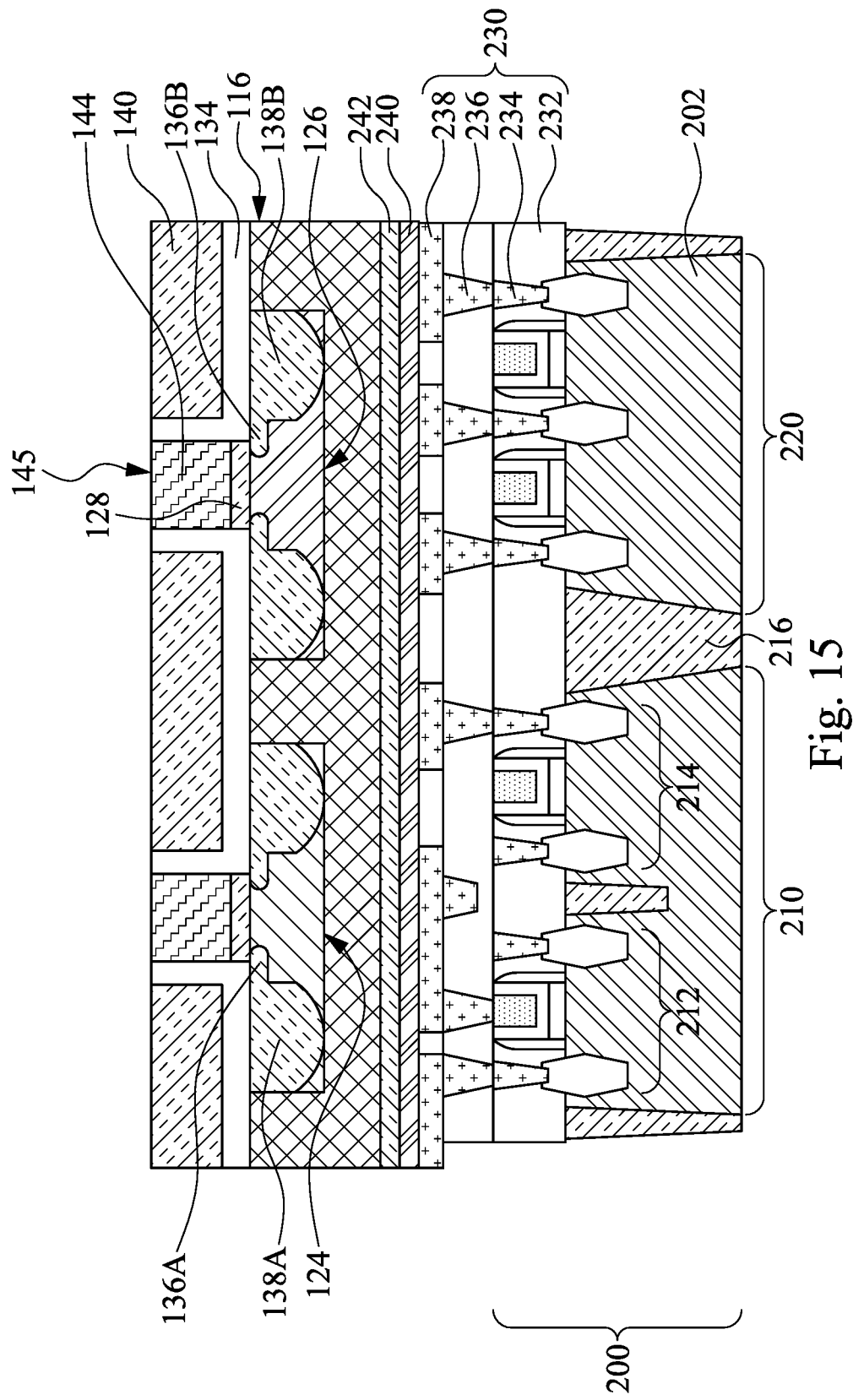
Figure 16:
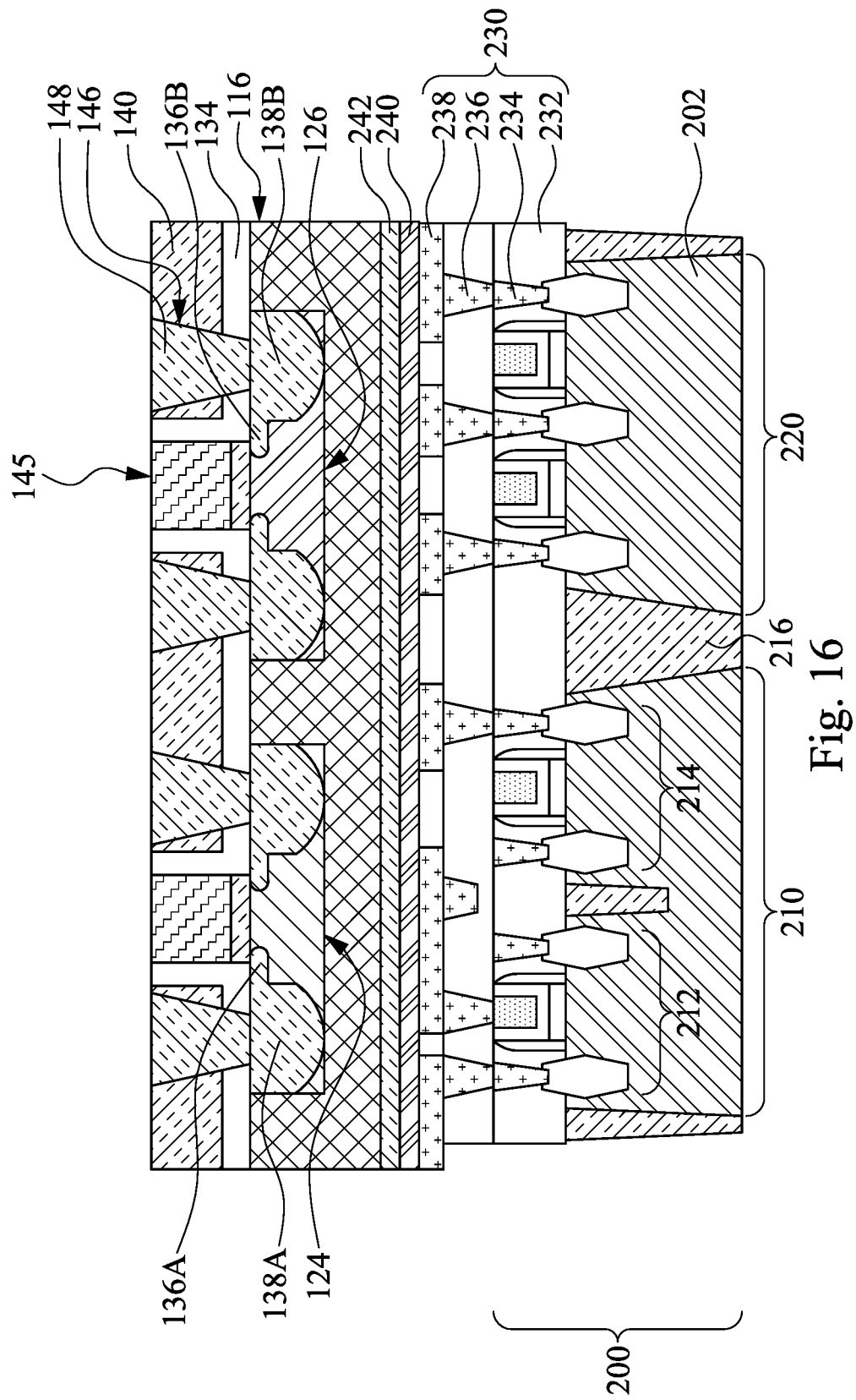
Figure 17:
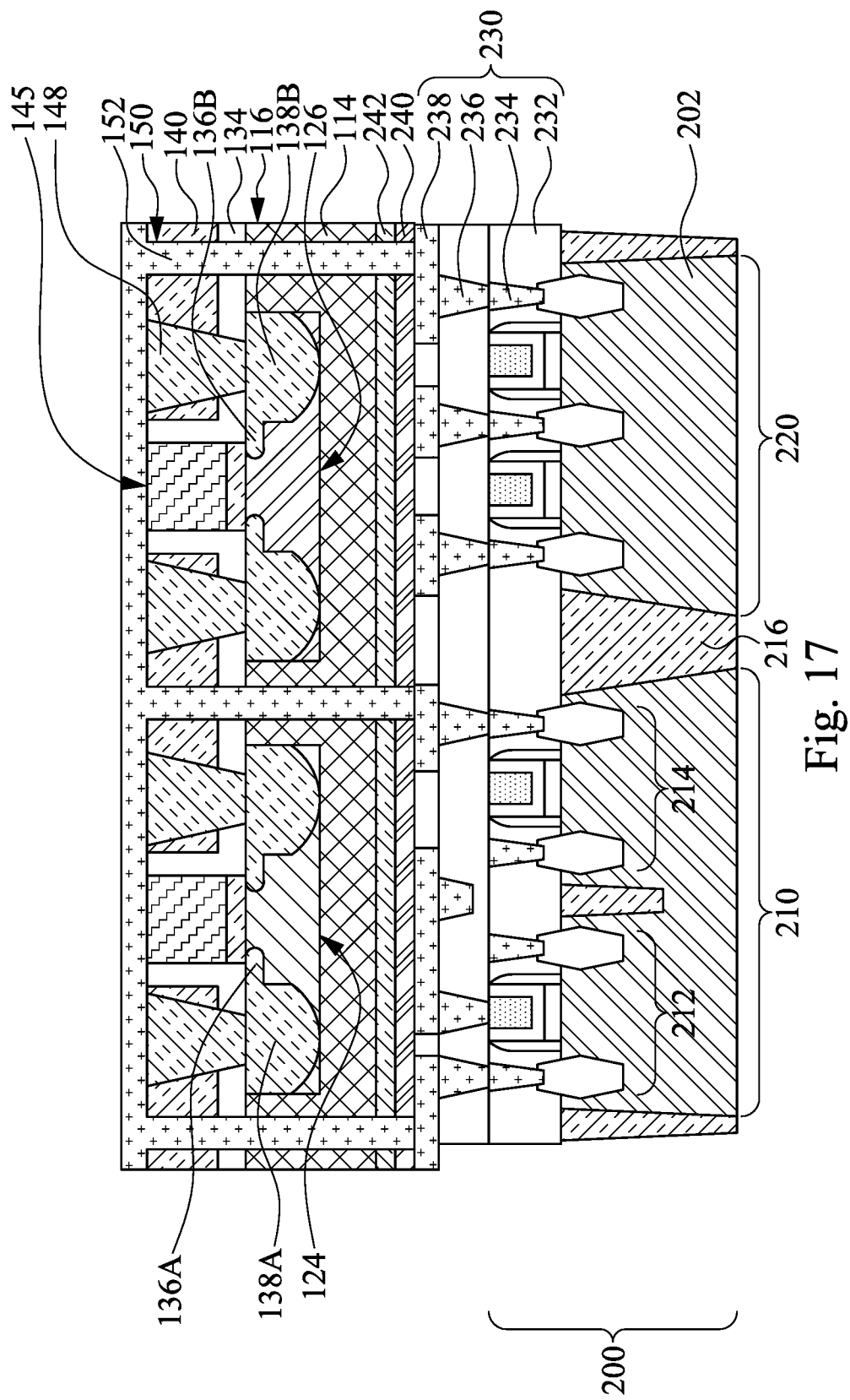
Figure 18:
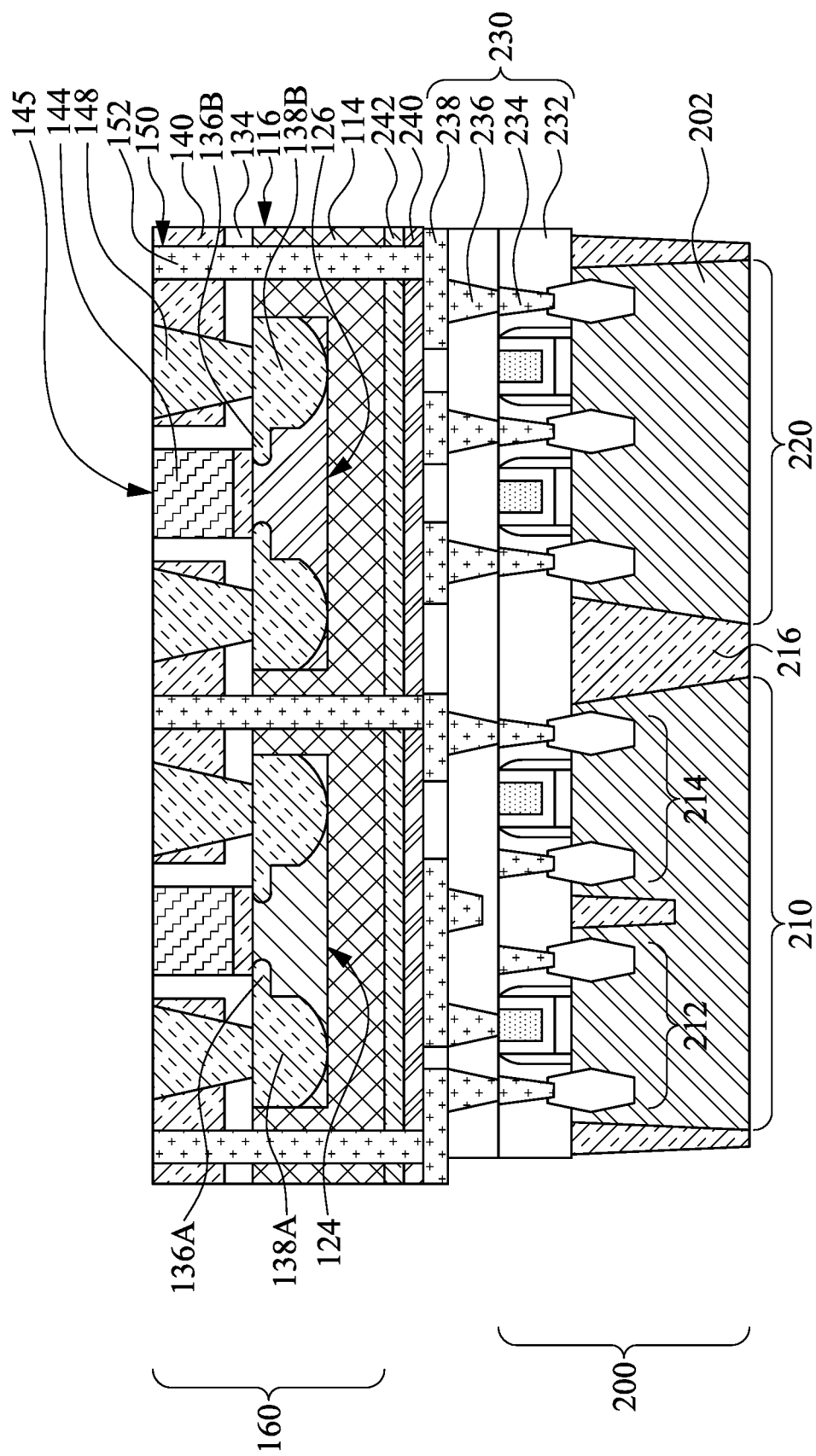
Figure 19:
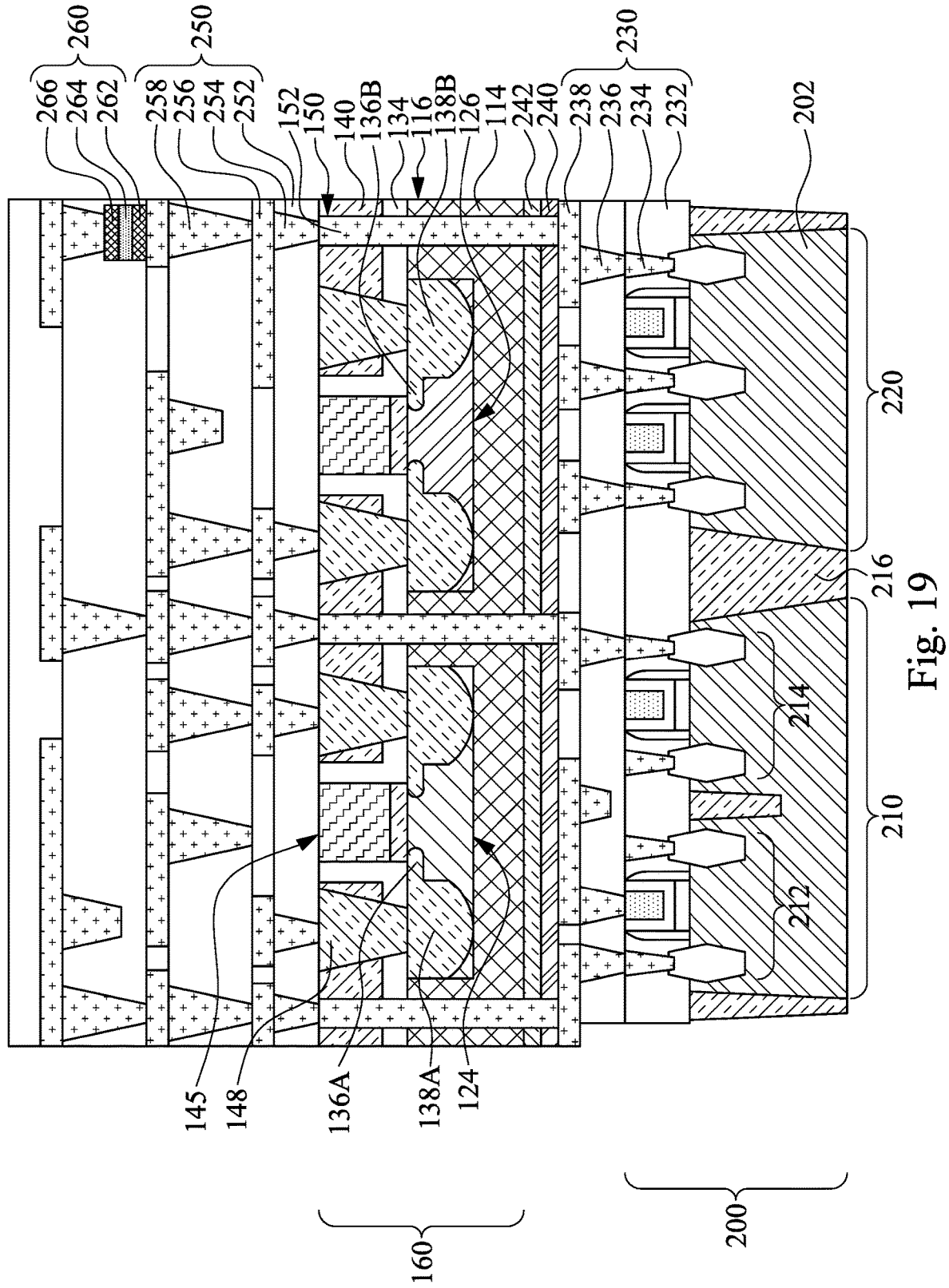

The method begins with block S10 in which a first substrate 100 is patterned through a first opening 104 of a photoresist layer 102 to form a recess 106 on the first substrate 100 (as shown in FIG. 2). The method continues with block S20 in which an epitaxial layer 108 having a material different from the first substrate 100 is formed in the recess 106. (as shown in FIG. 3). The method continues with block S30 in which an etching process is performed to recess the first substrate 100 such that shallow trench isolation (STI) regions 110A, 110B, and 110C are formed (as shown in FIG. 4). The method continues with block S40 in which an deposition process is performed to form a first dielectric layer 114 (as shown in FIG. 5). The method continues with block S50 in which at least one impurity 118 is implanted into the first substrate 100 to form a buried layer 120 therein (as shown in FIG. 6). The method continues with block S60 in which second and third dielectric layers 240 and 242 are formed over a first bonding wafer 200 (as shown in FIG. 7). The method continues with block S70 in which the structure including the first substrate 100, the epitaxial layer 108, and the first dielectric layer 114 is flipped and bonded to the third dielectric layer 242 (as shown in FIG. 8). The method continues with block S80 in which the first substrate 100 is heated to separate the first substrate 100 into two portions along the buried layer 120 (as shown in FIG. 9). The method continues with block S90 in which a gate dielectric layer 128 and a dummy gate electrode layer 130 are formed (as shown in FIG. 10). The method continues with block S100 in which a spacer layer 134 is formed over the resulting structure illustrated in FIG. 10 (as shown in FIG. 11). The method continues with block S110 in which a nanosecond annealing process is performed on the resulting structure illustrated in FIG. 11 (as shown in FIG. 12). The method continues with block S120 in which a second interlayer dielectric (ILD) layer 140 is formed on the spacer layer 134 (as shown in FIG. 13). The method continues with block S130 in which the dummy gate electrode layer 130 is removed to form gate trenches 142 (as shown in FIG. 14). The method continues with block S140 in which metal gates 144 are formed in the gate trenches 142 (as shown in FIG. 15). The method continues with block S150 in which source/drain contacts 148 are formed (as shown in FIG. 16). The method continues with block S160 in which a through-substrate-via (TSV) structure is formed by filling TSV trenches 150 with a conductor 152 (as shown in FIG. 17). The method continues with block S170 in which a CMP process is performed to remove the excess conductor 152 outside the TSV trenches 150 (as shown in FIG. 18). The method continues with block S180 in which a second interconnect structure is formed (as shown in FIG. 19).

As shown in FIG. 2, a photoresist layer 102 is formed on a first substrate 100, in which the photoresist layer 102 has a first opening 104 to expose a portion of the first substrate 100. The first substrate 100 is patterned through the first opening 104 of the photoresist layer 102 to form a recess 106 on the first substrate 100. For example, during the patterning of the first substrate 100, the photoresist layer 102 can serves as a mask to protect the covered portion of the first substrate 100. In some embodiments, the patterning of the first substrate 100 may be performed by an etching process or by any other suitable removal process.

In some embodiments, the first substrate 100 includes a bulk silicon substrate. In some embodiments, the first substrate 100 may be silicon in a crystalline structure. In some embodiments, the first substrate 100 may include other elementary semiconductors, such as germanium, or include a compound semiconductor, such as silicon carbide, gallium arsenide, indium arsenide, or indium phosphide. In some embodiments, the first substrate 100 includes a silicon-oninsulator (SOI) substrate. The SOI substrate may be fabricated using separation by implantation of oxygen, wafer bonding, and/or other suitable methods.

As shown in FIG. 3, an epitaxial layer 108 having a material different from the first substrate 100 is formed in the recess 106. In some embodiments, an III-V compound semiconductor material may be formed in the recess 106 through epitaxial growth to form the epitaxial layer 108. The III-V compound semiconductor material may include, but is not limited to, InAs, AlAs, GaAs, InP, GaN, InGaAs, InAlAs, GaSb, AlSb, AlP, GaP, or the like. Then, the photoresist layer 102 (see FIG. 1) is removed from the first substrate 100.

As shown in FIG. 4, an etching process is performed to recess the first substrate 100 such that STI regions 110A, 110B, and 110C are formed, and then STI regions 110A, 110B, and 110C are filled with an oxide material (e.g., silicon oxide) to form STIs 112A, 112B, and 112C. In some embodiments, sidewalls of the STIs 112A, 112B, and 112C are vertical to the first substrate 100. For example, the STI regions 110A, 110B, and 110C are shaped as rectangles, and the STIs 112A, 112B, and 112C formed by filling the STI regions 110A, 110B, and 110C with the oxide material are rectangles as well.

As shown in FIG. 5, an deposition process is performed to form a first dielectric layer 114. In some embodiments, the first dielectric layer 114 includes an oxide material (e.g., silicon oxide). In some embodiments, the first dielectric layer 114 serves as a protection layer over the first substrate 100 to cover the first substrate 100, the epitaxial layer 108, and the STIs 112A, 112B, and 112C. In some embodiments, there exists a distinguishable interface between first dielectric layer 114 and at least one of the STIs 112A, 112B, and 112C. In some embodiments, the first dielectric layer 114 and at least one of the STIs 112A, 112B, and 112C may be merged with no distinguishable interface therebetween. In addition, a combination of the first dielectric layer 114 and the STIs 112A, 112B, and 112C can be referred to as a dielectric structure 116.

As shown in FIG. 6, at least one impurity 118 is implanted into the first substrate 100 to form a buried layer 120 therein. In some embodiments, the buried layer 120 is formed below the epitaxial layer 108, the STIs 112A, 112B, 112C, and the first dielectric layer 114 of the dielectric structure 116. In some embodiments, the impurity 118 may be hydrogen. For example, hydrogen ions may be implanted into the first substrate 100 to form the buried layer 120 below the epitaxial layer 108, the STIs 112A, 112B, 112C, and the first dielectric layer 114. The buried layer 120 may form a weakened plane, which benefits separating the first substrate 100 into two portions, in which the epitaxial layer 108, the STIs 112A, 112B, 112C, and the first dielectric layer 114 are together coupled to one of the two portions of the first substrate 100. Within the weakened plane, the implanted hydrogen ions may create damaged atomic bonds in the semiconductor crystal lattice, rendering the first substrate 100 susceptible to separation along the weakened plane. The implantation energy can be controlled to define the weakened plane at the desired depth. In some embodiments, other implanted species may be used. For example, the impurity 118 may include helium, and helium ions may be implanted into the first substrate 100. In some embodiments, the impurities may include, but are not limited to, hydrogen and helium. In some embodiments, hydrogen ions and helium ions may be implanted into the first substrate 100 during the ion implantation process.

As shown in FIG. 7, a first bonding wafer 200 includes a second substrate 202, a static random access memory (SRAM) device 210, and a magnetoresistive random access memory (MRAM) device 220. In some embodiments, the first bonding wafer 200 is an application specific integrated circuit (ASIC) die. In some embodiments, the second substrate 202 includes a bulk silicon substrate. In some embodiments, the second substrate 202 may be silicon in a crystalline structure. In some embodiments, the second substrate 202 may include other elementary semiconductors, such as germanium, or include a compound semiconductor, such as silicon carbide, gallium arsenide, indium arsenide, or indium phosphide. In some embodiments, the second substrate 202 includes a silicon-on-insulator (SOI) substrate. The SOI substrate may be fabricated using separation by implantation of oxygen, wafer bonding, and/or other suitable methods.

In some embodiments, the SRAM and MRAM devices 210 and 220 comprise semiconductor devices formed on the second substrate 202 which can be referred to as a wafer in the formation of the RAM and MRAM devices 210 and 220. In some embodiments, the SRAM and MRAM devices 210 and 220 comprise active and/or passive devices. For example, the SRAM and MRAM devices 210 and 220 may comprise metal-oxide-semiconductor field-effect transistors (MOSFETs) such as finFETs or gate all around (GAA) transistors formed on the second substrate 202. In some embodiments, the SRAM and MRAM devices 210 and 220 may comprise at least one transistor having at least one S/D feature within the second substrate 202, in which the S/D feature protrudes from the second substrate 202. In some embodiments, the SRAM device comprise at least one PMOS transistor 212 and at least one NMOS transistor 214.

In some embodiments, isolation regions 216 are arranged in the second substrate 202 to provide electrical isolation between the different devices or transistors. In some embodiments, at least one of the isolation regions 216 can be arranged between the SRAM and MRAM devices 210 and 220. In some embodiments, at least one of the isolation regions 216 can be arranged between the PMOS and NMOS transistors 212 and 214 of the SRAM device 210. In some embodiments, at least one of the isolation regions 216 may be, for example, a STI or a deep trench isolation (DTI).

A first interconnect structure 230 is formed over the second substrate 202. The first interconnect structure 230 includes first interlayer dielectric (ILD) layers 232, at least one first device contact layer 234, at least one first inter-wire via layer 236, and at least one first wiring layer 238. In some embodiments, the first ILD layers 232 may be, for example, silicon dioxide, a low k dielectric, some other dielectric, or a combination of the foregoing. In some embodiments, as used here, a low k dielectric is a dielectric with a dielectric constant k less than about 3.9.

The first wiring layer 238 is stacked with the first inter-wire via layer 236 and the first device contact layer 234 in the first ILD layers 232, such that the first device contact layer 234 is in contact with the semiconductor devices formed on the second substrate 202. In some embodiments, the first device contact layer 234 is made up of device contact plugs, the first inter-wire via layer 236 is made up of inter-wire vias, and the first wiring layer 238 is made up of wires. In some embodiments, the first device contact layer 234, the first inter-wire via layer 236, and the first wiring layer 238 are conductive and may be, for example, aluminum copper, copper, aluminum, tungsten, some other metal or conductive material, or a combination of the foregoing.

A second dielectric layer 240 is formed over and in contact with the first wiring layer 238 of the first interconnect structure 230. In some embodiments, the second dielectric layer 240 includes silicon nitride and is formed by a chemical vapor deposition (CVD) process. In some embodiments, the silicon nitride is formed by physical vapor deposition (PVD), atomic layer deposition (ALD), plasma enhanced CVD (PECVD) or other suitable techniques. A third dielectric layer 242 is formed over the second dielectric layer 240. In some embodiments, the third dielectric layer 242 includes an oxide material (e.g., silicon oxide). In some embodiments, the second dielectric layer 240 includes a material different from the third dielectric layer 242. For example, the second dielectric layer 240 is made of silicon nitride, and the third dielectric layer 242 is made of silicon oxide. In some embodiments, the third dielectric layer 242 is formed by a low temperature deposition process. Since the third dielectric layer 242 can be formed under low temperature, the components below the second dielectric layer 240 are prevented from damage during the formation of the third dielectric layer 242.

As shown in FIG. 8, the structure including the first substrate 100, the epitaxial layer 108, and the first dielectric layer 114 illustrated in FIG. 6 is flipped and bonded to the third dielectric layer 242, in which the first dielectric layer 114 of the dielectric structure 116 is attached to and in contact with the third dielectric layer 242. In some embodiments the structure including the first substrate 100, the epitaxial layer 108 is bonded to the third dielectric layer 242 by bonding the first dielectric layer 114 to the third dielectric layer 242. In some embodiments, a dielectric-to-dielectric bond that bonds the first dielectric layer 114 and the third dielectric layer 242 together is formed at an interface between the first dielectric layer 114 and the third dielectric layer 242. For example, the dielectric-to-dielectric bond is under the dielectric structure 116 and over the SRAM and MRAM devices 210 and 220. In some embodiments, after the first dielectric layer 114 is attached to the third dielectric layer 242, an annealing process is performed with a temperature in a range from 400° C. to 600° C. to improve the bonding strength.

As shown in FIG. 9, the first substrate 100 is heated to separate the first substrate 100 into two portions along the buried layer 120 (see FIG. 8). In some embodiments, a first portion of the first substrate 100 over the buried layer 120 (see FIG. 8) is separated from a second portion (coupling with the epitaxial layer 108 and the first dielectric layer 114) along the buried layer 120 (see FIG. 8) by heating the first substrate 100. The implanted ions (impurities 118 as shown in FIG. 6) in the buried layer 120 (see FIG. 8) are heated to produce gas, and the first and second portions of the first substrate 100 may be separated by the gas produced by the ions. In some embodiments, after the first portion of the first substrate 100 is separated from the second portion of the first substrate 100, a planarization process, such as a chemical mechanical polish (CMP) process, is performed to remove the excess dielectric structure 116 and the excess second portion of the first substrate 100 until reaching epitaxial layer 108, and therefore the epitaxial layer 108 is exposed. After the CMP process, the remained portion of the second portion of the first substrate 100 can be referred to as a first active region 124, and the epitaxial layer 108 is can be referred to as a second active region 126. In some embodiments, after the CMP process, the dielectric structure 116 may have concaves that receive the first and second active regions 124 and 126, and thus the first and second active regions 124 and 126 are embedded in the dielectric structure 116.

As shown in FIG. 10, a gate dielectric layer 128 is formed over the first and second active regions 124 and 126, and then a dummy gate electrode layer 130 is formed over the gate dielectric layer 128. Next, an etching process is performed such that the dummy gate electrode layer 130 and the gate dielectric layer 128 are patterned to form dummy gate structures 132A and 132B vertically overlapping with the first and second active regions 124 and 126 respectively. In some embodiments, a mask is formed on the dummy gate electrode layer 130 and the gate dielectric layer 128, in which the mask is used for serving as a hard mask for protecting the underlying dummy gate electrode layer 130 and the gate dielectric layer 128 against the etching process. In some embodiments, the mask may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

In some embodiments, the gate dielectric layer 128 is an oxide layer formed by a low temperature deposition process. In some embodiments, the gate dielectric layer 128 is made of high-k dielectric materials, such as metal oxides, transition metal-oxides, or the like. Examples of the high-k dielectric material include, but are not limited to, hafnium oxide, hafnium silicon oxide, hafnium tantalum oxide, hafnium titanium oxide, hafnium zirconium oxide, zirconium oxide, titanium oxide, aluminum oxide, hafnium dioxide-alumina alloy, or other applicable dielectric materials. In some embodiments, the gate dielectric layer 128 may be formed by a deposition processes, such as CVD, PVD, ALD, PECVD or other suitable techniques.

In some embodiments, the dummy gate electrode layer 130 may include polycrystalline-silicon (poly-Si), polycrystalline silicon-germanium (poly-SiGe), metallic nitrides, metallic silicides, metallic oxides, or metals. In some embodiments, the dummy gate electrode layer 130 includes a metal-containing material such as titanium nitride, tantalum nitride, tantalum carbide, cobalt, ruthenium, aluminum, combinations thereof, or multi-layers thereof. The dummy gate electrode layer 130 may be deposited by CVD, PVD, sputter deposition, or other techniques suitable for depositing conductive materials.

As shown in FIG. 11, a spacer layer 134 is formed over the dielectric structure 116, the first active region 124 and the second active region 126, in which the spacer layer 134 is adjacent to sidewalls of at least one of the gate structures 132A and 132B. In some embodiments, the spacer layer 134 is a screening layer used for implantation screening and elimination of the channeling effect in an ion implant process. In some embodiments, the spacer layer 134 is formed of silicon oxide, silicon nitride, silicon oxynitride, silicon carbide, fluoride-doped silicate glass (FSG), a low k dielectric material, and/or combinations thereof. In some embodiments, the spacer layer 134 may have a multiple-layers structure, for example, including one or more liner layers.

After the spacer layer 134 is formed, an ion implant process is performed to form source/drain (S/D) regions 136A and 136B and lightly doped source and drain (LDD) regions 138A and 138B. For example, the S/D regions 136A and the LDD regions 138A are created and embedded in the first active region 124, and the S/D regions 136B and the LDD regions 138B are created and embedded in the second active region 126. In some embodiments, during the ion implant process for forming the S/D regions 136A and 136B and the LDD regions 138A and 138B, at least one impurity is implanted into at least one of the first and second regions 124 and 126, in which the impurity includes an n-type dopant, such as phosphorous, or a p-type dopant, such as boron. In some embodiments, the S/D regions 136A in the first active region 124 are laterally spaced from sides of the dummy gate structures 132A (i.e. adjacent the regions of the first active region 124 underlying the dummy gate structure 132A), and the S/D regions 136B in the second active region 126 are laterally spaced from sides of the dummy gate structures 132B (i.e. adjacent the regions of the first active region 124 underlying the dummy gate structure 132B). In some embodiments, the S/D regions 136A and 136B and the LDD regions 138A and 138B in the first and second regions 124 and 126 are covered with the spacer layer 134.

In some embodiments, the S/D regions 136A and the LDD regions 138A in the first active region 124 and the S/D regions 136B and the LDD regions 138B in the second active region 126 are formed sequentially. For example, during a first ion implant process performed to form the S/D regions 136A and the LDD regions 138A in the first active region 124, the second active region 126 and the dummy gate structures 132B are covered with a photoresist pattern which may serve as an ion implant mask. After the S/D regions 136A and the LDD regions 138A are formed in the first active region 124, the photoresist pattern is removed, and then a second implant process is performed to form the S/D regions 136B and the LDD regions 138B in the second active region 126. Similarly, during the second ion implant process is performed, the first active region 124 and the dummy gate structures 132A are covered with another photoresist pattern. In some embodiments, the first active region 124 is a PMOS active region, and the S/D regions 136A and the LDD regions 138A formed in the first active region 124 are PMOS S/D regions and PMOS LDD regions. In some embodiments, the second active region 126 is an NMOS active region, and the S/D regions 136B and the LDD regions 138B formed in the second active region 126 are NMOS S/D regions and NMOS LDD regions.

As shown in FIG. 12, a nanosecond annealing process is performed on the resulting structure illustrated in FIG. 11 to remove the implantation-induced defects as well as to activate the dopant species. With a combination of the ion implant process and the nanosecond annealing process, lattice damage of the resulting structure illustrated in FIG. 11 may be reduced.

As shown in FIG. 13, a second ILD layer 140 is formed on the spacer layer 134. In some embodiments, a CMP process may be performed to remove excessive material of the second ILD layer 140 to expose the dummy gate structures 132A and 132B to a subsequent dummy gate removal process. In some embodiments, the CMP process may planarize a top surface of the second ILD layer 140 with top surfaces of the dummy gate structures 132A and 132B and the spacer layer 134. In some embodiments, the second ILD layer 140 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the second ILD layer 140 may be formed using, for example, CVD, ALD, spin-on-glass (SOG) or other suitable techniques.

As shown in FIG. 14, the dummy gate electrode layer 130 is removed to form gate trenches 142 with the spacer layer 134 as its sidewalls. In some embodiments, the dummy gate electrode layer 130 (see FIG. 10) is removed by performing an etching process. In some embodiments, the etching process for removing the dummy gate electrode layer 130 (see FIG. 10) is a dry etching process including using an etching gas such as $CF_4$, Ar, $NF_3$, $Cl_2$, He, HBr, $O_2$, $N_2$, $CH_3F$, $CH_4$, $CH_2F_2$, or combinations thereof.

As shown in FIG. 15, metal gates 144 are formed in the gate trenches 142, and a planarization process, such as a CMP process, is then performed to remove the excess metal gates 142 until reaching the spacer layer 134 and the second ILD layer 140. The gate dielectric layer 128 and the metal gate 144 can be in combination referred to as a gate stack 145 in contact with at least one of the first and second active regions 124 and 126. If the gate dielectric layer 128 is a high-k dielectric layer, the gate stack can be referred to as a high-k metal gate (HKMG) stack. In some embodiments, at least one of the metal gates 144 includes, for example work function (WF) layers, barrier layers, fill metal layer, liner layer, wetting layer, and adhesion layer. In some embodiments, at least one of the metal gates 144 is formed by ALD, PVD, CVD, or other suitable process. For example, a Ti layer may be deposited to function as a wetting layer for a subsequent metal filling, in which the Ti layer may be formed by PVD or other suitable process.

In some embodiments, the first active region 124 and a portion of the gate stack 145 over the first active region 124 can be in combination referred to as at least one MOSFET such as a planar transistor. In some embodiments, the second active region 126 and a portion of the gate stack 145 over the second active region 126 can be in combination referred to as at least one MOSFET such as a planar transistor. In some embodiments, at least one of the SRAM and MRAM devices 210 and 220 may comprise at least one first transistor having a first gate length, and the gate stack 145 and at least one of the first and second regions 124 and 126 can be in combination referred to as at least one second transistor having a second gate length, in which the first gate length is shorter than the second gate length. For example, at least one of the SRAM and MRAM devices 210 and 220 may comprise at least one first transistor having a first gate length, the second active region 126 and the portion of the gate stack 145 over the second active region 126 are in combination referred to as a second transistor having a second gate length, and the first active region 124 and the portion of the gate stack 145 over the first active region 124 are in combination referred to as a third transistor having a third gate length, in which the first gate length is shorter than the second gate length and third gate length.

In some embodiments, at least one of the SRAM and MRAM devices 210 and 220 may comprise at least one first transistor having a first channel region made of a first material, and the gate stack 145 and at least one of the first and second regions 124 and 126 can be in combination referred to as at least one second transistor having a second channel region made of a second material which is different from the first material. For example, at least one of the SRAM and MRAM devices 210 and 220 may comprise at least one first transistor having a first channel region made of a silicon material, and the second active region 126 and the portion of the gate stack 145 over the second active region 126 are in combination referred to as a second transistor having a second channel region made of an III-V compound semiconductor material.

Since the formation of the first channel region of the first bonding wafer 200 is independent of the formation of at least one of the first and second active regions 124 and 126, the choice of the materials used for forming the channel regions is flexible. Therefore, the channel regions made of different materials can be manufactured and stacked in the same semiconductor device. Furthermore, the first active region 124 and the portion of the gate stack 145 over the first active region 124 can be in combination referred to as a first input/output (I/O) device corresponding with the SRAM device 210, and the second active region 126 and the portion of the gate stack 145 over the second active region 126 can be in combination referred to as a second (I/O) device corresponding with the MRAM device 220. Accordingly, the SRAM, MRAM, I/O devices can be stacked in the semiconductor device, and hence the device dimension is reduced.

In addition, in some embodiments, the second active region 126 and the portion of the gate stack 145 over the second active region 126 are in combination referred to as a second transistor having a second channel made of a second material, and the first active region 124 and the portion of the gate stack 145 over the first active region 124 are in combination referred to as a third transistor having a third channel made of a third material which is different from the second material. For example, the second transistor has the second channel made of an III-V compound semiconductor material, and the third transistor has the third channel made of a silicon material.

As shown in FIG. 16, an etching process is performed on the spacer layer 134 and the second ILD layer 140. In the etching process, a layer of photoresist may be applied to the top surfaces of the spacer layer 134 and the second ILD layer 140, and then the layer of photoresist is patterned, such as by a photolithography or e-beam process. In some embodiments, the etching process may utilize a directional, or anisotropic, etching technique configured to etch vertically through the spacer layer 134 and the second ILD layer 140 with minimal lateral etching. This produces first holes 146 in the spacer layer 134 and the second ILD layer 140 for subsequent contact formation. While an anisotropic etching technique is shown, the etching process may include any suitable anisotropic or isotropic etching technique including dry etching, wet etching, reactive ion etching RIE, and combinations thereof. Furthermore, the etching process may use any suitable etch chemistry or combination thereof. In some embodiments, the etchants and other etching parameters may be tuned so that the exposed materials of the spacer layer 134 and the second ILD layer 140 are removed without etching other materials such as the materials of the gate structures. For example, in some embodiments, a dry, anisotropic plasma etch equipped with fluorine-containing gases, such as $CF_4$, $CH_2F_2$, or $C_4F_6$, is used. In order to achieve a proper etch profile and selectivity, the anisotropic plasma etch may include multiple etch portions, such as a main etch, an over etch and a post etch treatment. In some embodiments, the dry etch creates first holes 146 with substantially vertical profiles that stop at the top surfaces of the S/D regions 138A and 138B. As a result, the first holes 146 above the S/D regions 138A and 138B can be referred to as source/drain contact holes.

In some embodiments, silicide features are formed from the exposed S/D regions 138A and 138B. In some embodiments, formation of the silicide features includes using a metal to form self-aligned silicide materials to the exposed S/D regions 138A and 138B. The metal includes titanium, cobalt, tantalum, niobium, or combinations thereof. In some embodiments, the formation of the silicide features involves using an anneal to form the silicide features and then removing the unreacted metal. Next, source/drain contacts 148 are formed in the source/drain contact holes.

As shown in FIG. 17, an etching process is performed on the second ILD layer 140, the spacer layer 134, the dielectric structure 116, the third dielectric layer 242, and the second dielectric layer 240. In the etching process, a layer of photoresist may be applied to the top surface of the second ILD layer 140, and then the PR is patterned, such as by a photolithography or e-beam process. In some embodiments, the etching process may utilize a directional, or anisotropic, etching technique configured to etch vertically through the second ILD layer 140, the spacer layer 134, the dielectric structure 116, the third dielectric layer 242, and the second dielectric layer 240 with minimal lateral etching. While an anisotropic etching technique is shown, the etching process may include any suitable anisotropic or isotropic etching technique including dry etching, wet etching, reactive ion etching RIE, and combinations thereof. Furthermore, the etching process may use any suitable etch chemistry or combination thereof. In some embodiments, the etchants and other etching parameters may be tuned so that the exposed materials of the second ILD layer 140, the spacer layer 134, the dielectric structure 116, the third dielectric layer 242, and the second dielectric layer 240 are removed without etching other materials such as the materials of the first active region 124 and the second active region 126. For example, in some embodiments, a dry, anisotropic plasma etch equipped with fluorine-containing gases, such as CF4, CH2F2, or C4F6, is used. In order to achieve a proper etch profile and selectivity, the anisotropic plasma etch may include multiple etch portions, such as a main etch, an over etch and a post etch treatment. In some embodiments, the etching process creates a plurality of TSV trenches 150 with substantially vertical profiles that stop at the top surfaces of the first wiring layer 238, and hence the first wiring layer 238 are exposed.

In some embodiments, the TSV trenches 150 are laterally arranged. In some embodiments, the TSV trenches 150 are laterally spaced from sides of at least one of the first active region 124 and the second active region 126, and thus the TSV trenches 150 are adjacent to the first active region 124 and the second active region 126. In some embodiments, at least one of the TSV trenches 150 is between the first active region 124 and the second active region 126. Next, a conductor 152, such as tungsten, may be deposited into the TSV trenches 150 to form a TSV structure extending the second ILD layer 140, the spacer layer 134, the dielectric structure 116, the third dielectric layer 242, in which the conductor 152 of the TSV structure is electrically coupled and in contact with the first wiring layer 238. In addition, since at least one of the TSV trenches 150 is between the first active region 124 and the second active region 126, a portion of the conductor 152 of the TSV structure is between the first active region 124 and the second active region 126 as well.

As shown in FIG. 18, a CMP process is performed to remove the excess conductor 152 outside the TSV trenches 150. In some embodiments, a top surface of the conductor 152 is flush with the top surfaces of the source/drain contacts 148, the gate stack 145, the second ILD layer 140, and the spacer layer 134. In addition, the resulting structure over the first interconnect structure 230 can be referred to as a second bonding wafer 160. For example, the second bonding wafer 160 may include the dielectric structure 116, the first active region 124, the second active region 126, and the gate stack 145.

As shown in FIG. 19, a second interconnect structure 250 is formed over the second bonding wafer 160. The second interconnect structure 250 includes third ILD layers 252, at least one second device contact layer 254, second wiring layers 256, and second inter-wire via layers 258. In some embodiments, the third ILD layers 252 may be, for example, silicon dioxide, a low k dielectric, some other dielectric, or a combination of the foregoing. In some embodiments, as used here, a low k dielectric is a dielectric with a dielectric constant k less than about 3.9.

The second wiring layers 256 are stacked with the second inter-wire via layers 258 and the second device contact layer 254 in the first ILD layers 232, such that the second device contact layer 254 in contact with the source/drain contacts 148 and the conductor 152 of the TSV structure. Accordingly, the second device contact layer 254 is electrically coupled to the source/drain contacts 148 and the conductor 152 of the TSV structure, and thus the second device contact layer 254 is able to electrically couple to at least one of the first and second active regions 124 and 126 through the source/drain contacts 148. In some embodiments, the second device contact layer 254 is made up of device contact plugs, the second inter-wire via layers 258 are made up of inter-wire vias, and the second wiring layers 256 are made up of wires. In some embodiments, the second device contact layer 254, the second inter-wire via layers 258, and the second wiring layers 256 are conductive and may be, for example, aluminum copper, copper, aluminum, tungsten, some other metal or conductive material, or a combination of the foregoing.

In some embodiments, the first interconnect structure 230, the second interconnect structure 250, and the TSV structure can be in combination referred to as an electrical interconnect structure, and the second bonding wafer 160 is electrically coupled to the first bonding wafer 200 through the electrical interconnect structure. In some embodiments, the first active region 124 and the portion of the gate stack 145 over the first active region 124 are in combination referred to as a transistor electrically coupled at least one of transistors of the SRAM devices 210. In some embodiments, the second active region 126 and the portion of the gate stack 145 over the second active region 126 are in combination referred to as a transistor electrically coupled at least one of transistors of the MRAM devices 220. In some embodiments, after forming the second interconnect structure 250, another one interconnect structure may be formed over the second interconnect structure 250.

In some embodiments, at least one metal-insulator-metal (MIM) structure 260 is formed over the second bonding wafer 160. In some embodiments, the MIM structure 260 is electrically coupled to the MRAM device 220 through the second interconnect structure 250, the conductor 152 of the TSV structure, and the first interconnect structure 230, and the MIM structure 260 serves as a memory element of the MRAM device 220. For example, the MIM structure can serves as a MRAM module. In some embodiments, The MIM structure 260 may include a bottom electrode 262 and a top electrode 266, with a fourth dielectric layer 264 in between the two electrodes. The fourth dielectric layer 264 can be referred to as an insulator layer in some cases.

In some embodiments, after forming the MIM structure 260 and another interconnect structure over the MIM structure, a singulation process is performed to saw the resulting structure illustrated in FIG. 19, and the first bonding wafer 200 and the second bonding wafer 160 can be singulated as first dies and second dies bonded to respective first dies by the dielectric-to-dielectric bond.

As described above, since the formation of the first channel region of the first die is independent of the formation of at least one of the first and second active regions, the choice of the materials used for forming the channel regions is flexible. Therefore, the channel regions made of different materials can be manufactured and stacked in the same semiconductor device. Similarly, since the formation of the transistors of the first die is independent of the formation of the transistors of the second bonding wafer, the dimension of the transistors of the first die may be different from that of the second bonding wafer. For example, the transistors of the first die can be manufactured in 3D dimension, and the transistors of the second bonding wafer can be manufactured in 2D dimension. Furthermore, the first and second I/O devices corresponding with the SRAM and MRAM of the first die are formed in the second bonding wafer which is over the first die, and therefore the SRAM, MRAM, I/O devices can be stacked in the semiconductor device, thereby reducing the device dimension.

According to various embodiments of the present disclosure, a semiconductor device is provided. The semiconductor device includes a first transistor, a first interconnect structure, and a second transistor. The first transistor has a first gate length. The first interconnect structure is over the first transistor. The second transistor is over the first interconnect structure. The second transistor is electrically coupled to the first transistor through the first interconnect structure. The second transistor has a second gate length, and the first gate length is shorter than the second gate length.

According to various embodiments of the present disclosure, a semiconductor device is provided. The semiconductor device includes a first transistor, a first interconnect structure, a second transistor, and a third transistor. The first interconnect structure is over the first transistor. The second transistor is over the first interconnect structure. The third transistor is over the first interconnect structure, in which channel regions of the second transistor and of the third transistor are made of different materials.

According to various embodiments of the present disclosure, a method for manufacturing a semiconductor device is provided. The method includes following steps. An epitaxial layer is grown on a first region of a first wafer while remaining a second region of the first wafer exposed. A first dielectric layer is formed over the epitaxial layer and the second region. The first transistor is formed on a second wafer. The second dielectric layer is formed over the first transistor. The first and second dielectric layers are bonded. Second and third transistors are formed on the epitaxial layer and on the second region of the first wafer, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a plurality of first transistors;
a first interconnect structure over the plurality of first transistors;
a second transistor over the first interconnect structure, the second transistor electrically coupled to one of the plurality of first transistors through the first interconnect structure, wherein the second transistor comprising an active region and a gate stack over the active region, and the active region of the second transistor vertically overlaps two of the plurality of first transistors;
a dielectric structure, wherein the active region is embedded in the dielectric structure, and the dielectric structure has a top surface in a position lower than a top surface of the gate stack of the second transistor; and
a through via structure having a sidewall extending along a straight line continuously from a position lower than a bottommost position of the active region to a position level with a topmost position of the gate stack of the second transistor.

2. The semiconductor device of claim 1, further comprising:
a first dielectric layer between the first interconnect structure and the second transistor; and
a second dielectric layer between the first dielectric layer and the second transistor, wherein the first dielectric layer comprises a material different from the second dielectric layer.

3. The semiconductor device of claim 2, wherein the first interconnect structure comprises a wiring layer between the plurality of first transistors and the first dielectric layer and in contact with the first dielectric layer.

4. The semiconductor device of claim 1, further comprising:
a dielectric-to-dielectric bond between the plurality of first transistors and the second transistor.

5. A semiconductor device, comprising:
a plurality of first transistors;
a first interconnect structure over the plurality of first transistors;
a second transistor over the first interconnect structure;
a third transistor over the first interconnect structure, wherein active regions of the second transistor and of the third transistor are made of different materials, the active region of the second transistor vertically overlaps two of the plurality of first transistors, and the active region of the third transistor vertically overlaps two of the plurality of first transistors;
a dielectric layer having a first portion in contact with bottom surfaces of the active regions and a second portion extending upwards from the first portion, wherein the first portion and the second portion of the dielectric layer have the same material;
a spacer layer in contact with a sidewall of a gate stack of the third transistor and a top surface of the second portion of the dielectric layer; and
a through via structure having a sidewall extending along a straight line continuously from a position lower than a bottommost position of the active regions to a position level with a topmost position of the gate stack of the third transistor.

6. The semiconductor device of claim 5, further comprising:
a dielectric-to-dielectric bond under the second transistor.

7. The semiconductor device of claim 6, wherein the dielectric-to-dielectric bond is further under the third transistor.

8. The semiconductor device of claim 6, wherein the dielectric-to-dielectric bond is further over the plurality of first transistors.

9. The semiconductor device of claim 5, wherein the active region of the second transistor is made of silicon, and the active region of the third transistor is made of III-V compound.

10. The semiconductor device of claim 5, wherein one of the plurality of first transistors has a channel shorter than the channel of the second transistor.

11. The semiconductor device of claim 10, wherein the channel of the one of the plurality of first transistors is further shorter than the channel of the third transistor.

12. A semiconductor device, comprising:
a plurality of first transistors;
a dielectric layer over the plurality of first transistors;
a second transistor over the plurality of first transistors and having an active region vertically overlapping two of the plurality of first transistors, wherein the dielectric layer is in contact with a bottom surface and sidewalls of the active region;
a through via structure extending through the dielectric layer and electrically coupled to one of the plurality of first transistors, the through via structure having a top surface in a position higher than a top surface of the dielectric layer, and the top surface of the through via structure being level with a top surface of a metal gate of the second transistor, wherein the through via structure has a sidewall extending along a straight line continuously from a position lower than a bottommost position of the active region to a position level with a topmost position of the metal gate of the second transistor; and
a metal-insulator-metal (MIM) structure over the second transistor and electrically coupled to one of the plurality of first transistors through the through via structure.

13. The semiconductor device of claim 12, further comprising:
a source contact landing on a source of the second transistor, wherein a top surface of the through via structure is substantially coplanar with a top surface of the source contact.

14. The semiconductor device of claim 1, wherein the top surface of the dielectric structure is substantially level with a top surface of the active region of the second transistor.

15. The semiconductor device of claim 1, wherein the active region of the second transistor comprises silicon.

16. The semiconductor device of claim 5, wherein a channel region of one of the plurality of first transistors is made of a same material as the channel region of the second transistor.

17. The semiconductor device of claim 12, wherein the active region is made of silicon.

18. The semiconductor device of claim 12, wherein the metal gate of the second transistor has a bottom surface higher than a bottom surface of the through via structure.

19. The semiconductor device of claim 5, wherein the spacer layer has a vertical portion in contact with a sidewall of the gate stack of the third transistor and a lateral portion in contact with the top surface of the second portion of the dielectric layer, wherein the sidewall of the through via structure extends through the lateral portion of the spacer layer along the straight line.

20. The semiconductor device of claim 1, wherein the second transistor has a source region vertically overlapping a first one of the two of the plurality of first transistors, and a drain region vertically overlapping a second one of the two of the plurality of first transistors.

* * * * *